US012069967B2

(12) United States Patent
Cantaloube

(10) Patent No.: US 12,069,967 B2
(45) Date of Patent: Aug. 20, 2024

(54) INTEGRATED CIRCUIT INCLUDING TWO SUBSTRATES WITH QUBITS DISPOSED WITHIN ONE OF THE TWO SUBSTRATES

(71) Applicant: Microsoft Technology Licensing, LLC, Redmond, WA (US)

(72) Inventor: Christopher A. Cantaloube, Boca Raton, FL (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 76 days.

(21) Appl. No.: 17/863,213

(22) Filed: Jul. 12, 2022

(65) Prior Publication Data

US 2022/0352453 A1    Nov. 3, 2022

Related U.S. Application Data

(62) Division of application No. 16/858,812, filed on Apr. 27, 2020, now Pat. No. 11,417,819.

(51) Int. Cl.
| | |
|---|---|
| *H10N 60/81* | (2023.01) |
| *H01L 23/00* | (2006.01) |
| *H10N 60/01* | (2023.01) |
| *H10N 60/12* | (2023.01) |

(Continued)

(52) U.S. Cl.
CPC ........... *H10N 60/815* (2023.02); *H01L 24/08* (2013.01); *H01L 24/80* (2013.01); *H10N 60/0912* (2023.02); *H10N 60/12* (2023.02); *H10N 60/805* (2023.02); *H10N 69/00* (2023.02); *H01L 2224/08146* (2013.01); *H01L 2224/80895* (2013.01); *H01L 2224/80896* (2013.01)

(58) Field of Classification Search
None
See application file for complete search history.

(56) References Cited

U.S. PATENT DOCUMENTS

2010/0244201 A1   9/2010   Kitada
2011/0163455 A1*  7/2011   Gaidis ............... H01L 21/76886
                                              438/599

(Continued)

FOREIGN PATENT DOCUMENTS

WO      2017105524 A1    6/2017

OTHER PUBLICATIONS

"Extended European Search Report Issued in Application No. 23151185.8", Mailed Date: Jun. 2, 2023, 5 Pages.

(Continued)

*Primary Examiner* — Scott B Geyer
(74) *Attorney, Agent, or Firm* — Ranjeev Singh; Singh Law, PLLC

(57) ABSTRACT

An integrated circuit is provided that comprises a first substrate having a plurality of conductive contact pads spaced apart from one another on a surface of the first substrate, a dielectric layer overlying the first substrate and the plurality of conductive contact pads, and a second substrate overlying the dielectric layer. A plurality of superconducting contacts extend through the second substrate and the dielectric layer to the first substrate, wherein each superconducting contact of the plurality of superconducting contacts is aligned with and in contact with a respective conductive contact pad of the plurality of conductive contact pads.

20 Claims, 6 Drawing Sheets

(51) Int. Cl.
*H10N 60/80* (2023.01)
*H10N 69/00* (2023.01)

(56) References Cited

U.S. PATENT DOCUMENTS

| | | | | |
|---|---|---|---|---|
| 2012/0074585 A1* | 3/2012 | Koo | ................... | H01L 23/147 |
| | | | | 257/774 |
| 2012/0292745 A1* | 11/2012 | Park | ................... | H01L 23/3128 |
| | | | | 257/E21.705 |
| 2014/0213017 A1* | 7/2014 | Kim | ................... | H01L 25/50 |
| | | | | 438/107 |
| 2015/0123278 A1* | 5/2015 | Park | ................... | H01L 24/03 |
| | | | | 257/774 |
| 2015/0145094 A1 | 5/2015 | Liu et al. | | |
| 2017/0373044 A1* | 12/2017 | Das | ................... | H01L 21/02345 |
| 2018/0102470 A1* | 4/2018 | Das | ................... | H01L 23/5384 |
| 2018/0331057 A1 | 11/2018 | Abraham et al. | | |
| 2018/0331108 A1* | 11/2018 | Hutin | ................... | G06N 10/00 |
| 2018/0366634 A1* | 12/2018 | Mutus | ................... | H01L 25/18 |
| 2019/0051621 A1* | 2/2019 | Liu | ................... | H01L 23/49838 |
| 2019/0088552 A1* | 3/2019 | Yu | ................... | H01L 21/56 |
| 2020/0006178 A1* | 1/2020 | Huang | ................... | H01L 24/32 |
| 2020/0401924 A1* | 12/2020 | Paik | ................... | G06N 10/00 |
| 2021/0305162 A1* | 9/2021 | Ganesan | ................... | H01L 23/367 |
| 2022/0208726 A1* | 6/2022 | Talanov | ................... | G06F 1/10 |

OTHER PUBLICATIONS

"International Search Report and Written Opinion Issued in PCT Application No. PCT/US21/024070", Mailed Date: Jul. 7, 2021, 11 Pages.

Communication under Rule 71(3) EPC Received for European Application No. 23151185.8, mailed on Dec. 8, 2023, 29 pages.

Decision to grant a European patent pursuant to Article 97(1) EPC, Received for European Application No. 23151185.8, mailed on Apr. 18, 2024, 02 pages.

* cited by examiner

INTEGRATED CIRCUIT INCLUDING TWO SUBSTRATES WITH QUBITS DISPOSED WITHIN ONE OF THE TWO SUBSTRATES

CROSS-REFERENCE TO A RELATED APPLICATION

This application is a divisional of U.S. application Ser. No. 16/858,812, filed Apr. 27, 2020, titled "FORMING A BUMPLESS SUPERCONDUCTOR DEVICE BY BONDING TWO SUBSTRATES VIA A DIELECTRIC LAYER," the entire contents of which are hereby incorporated herein by reference.

TECHNICAL FIELD

The present disclosure relates generally to integrated circuits, and more particularly to a bumpless superconductor device.

BACKGROUND

High density three-dimensional (3D) chip integration techniques generally involve the bonding of two separate substrates/chips using some variation of bump bonding. Bumps are raised metallic pillars/spheres on the order of 25-200 um in diameter and 10-200 um tall formed on the surface of chips/substrates. Bump bonding requires that the substrates to be joined are "bumped" with a suitable joining metal (SnPb, SnAg, SnCu, In, etc.). Substrate bumping involves the patterning and deposition of under bump metallization layers (ex. Ti, TiW, Cr, Pd, Ni, etc.) which act as adhesion promoters and/or diffusion barriers followed by plating of the aforementioned joining metal. Once "bumped" the substrates or chips are joined by precisely aligning the bumps and applying either force, temperature, ultrasonic power, or a combination thereof to form conducting metallic joints between the two chips. Subsequent to this joining process it is standard for a thermoset polymer material (typically epoxy based) called an underfill to be dispensed between the two joined layers which acts as a stress buffer and isolates the bumps from the ambient environment.

The drive for lower power, lower latency, higher interconnect density requires that the chip-to-chip connections become smaller in diameter and tighter in pitch. State of the art volume production chip bumping used in HBM (high bandwidth memory) currently utilizes Cu-pillar microbumps on the order of 25 um diameter and bump pitches of 55 um. Beyond this and indeed even at this stage the cost of this packaging integration is driving the use of this technology only for the high-end of the CPU, NPU, CPU markets among others. At these pitches and diameters, it becomes difficult to maintain bump yield and bonding yield as alignment and planarity of the bonding process needs to be precisely controlled in order to insure that all bumps are joined. Generally flip chip bonding of this sort is not reworkable. Additionally, a side effect of shrinking bump diameters is a decrease in bump heights and therefore decrease in chip-to-chip spacing as there are limitation to the aspect ratio of plated pillars. This increases the stress on the bumps which is a function of stand-off height. It also places additional constraints on the underfill materials and underfill dispense process as highly engineered low viscosity materials needs to be developed to fill these tight gaps and very precise liquid dispense tools to ensure that underfill dispense volumes are consistent.

SUMMARY

In one example, an integrated circuit is provided that comprises a first substrate having a plurality of conductive contact pads spaced apart from one another on a surface of the first substrate, a dielectric layer overlying the first substrate and the plurality of conductive contact pads, and a second substrate overlying the dielectric layer. A plurality of superconducting contacts extend through the second substrate and the dielectric layer to the first substrate, wherein each superconducting contact of the plurality of superconducting contacts is aligned with and in contact with a respective conductive contact pad of the plurality of conductive contact pads.

In another example, a method of forming a superconductor device is disclosed. The method comprises providing a first substrate having a plurality of conductive contact pads spaced apart from one another on a surface of the first substrate, disposing a dielectric layer over the first substrate and the plurality of conductive contact pads, and disposing a second substrate over the dielectric layer. A plurality of vias are formed from a top surface of the second substrate, through the second substrate and the dielectric layer to the first substrate with each via extending to and being aligned with a respective conductive contact pad of the plurality of conductive contact pads. The method further comprises performing a contact material fill to fill the plurality of vias with superconducting material and form a plurality of superconducting contacts extending through the second substrate and the dielectric layer to the first substrate, wherein each superconducting contact of the plurality of superconducting contacts is aligned with and in contact with a respective conductive contact pad of the plurality of conductive contact pads.

In yet a further example, a method of forming an integrated circuit is disclosed. The method comprises providing a first substrate having a plurality of conductive contact pads spaced apart from one another on a surface of the first substrate, disposing a dielectric layer over the first substrate and the plurality of conductive contact pads, and performing a first etch on the dielectric layer to provide extended via openings through the dielectric layer to the first substrate with each extended via openings being aligned with a respective conductive contact pad of the plurality of conductive contact pads. The method further comprises performing a second etch on the second substrate to form a plurality of through substrate via (TSV) openings in the second substrate, and disposing the second substrate over the dielectric layer with the plurality of TSV openings being aligned with the plurality of extended via openings to form a plurality of vias from a top surface of the second substrate, through the second substrate and the dielectric layer to the first substrate with each via extending to and being aligned with a respective conductive contact pad of the plurality of conductive contact pads. The method also comprises performing a contact material fill to fill the plurality of vias with superconducting material and form a plurality of superconducting contacts extending through the second substrate and the dielectric layer to the first substrate, wherein each superconducting contact of the plurality of superconducting contacts is aligned with and in contact with a respective conductive contact pad of the plurality of conductive contact pads.

DETAILED DESCRIPTION

The present disclosure describes a bumpless superconductor device and methods of making a bumpless superconductor device. In one example, two substrates are joined together via a dielectric material. As an example, a spin-on thermally curable polymer dielectric can be deposited on a first substrate (e.g., formed of silicon, glass, compound semiconductors, or a variety of other semiconductor materials). A second substrate (e.g., formed of silicon, glass, compound semiconductors, or a variety of other semiconductor materials) can then be aligned and bonded to this substrate face up or face down. The application of heat during bonding cures the polymer resulting in the substrates being joined. A substrate can be either in chip or wafer format. Subsequently, high aspect ratio vias (e.g., through substrate vias (TSVs)) are etched through the top substrate using, for example, masked plasma etching (e.g., by a Bosch process). Once the vias reach the dielectric layer between the two substrates, a different plasma gas mixture can be used to etch through this polymer or other dielectric (using the TSVs as an etch mask) down to respective metal pads on the bottom substrate. In this way, very dense and very small diameter vias can be formed. A dielectric liner can be deposited via PECVD or ALD followed by sputtering a conductive material to line or fill the vias. A variation of this process has the vias pre-etched in the second substrate and the dielectric layer and aligned to provide mating vias with the dielectric prior to or after the bonding process.

The present disclosure provides an alternative to bump bonding techniques of high density chip integration, and also reduces the burden of precise planarity control during the substrate bonding process. This technique also allows for the use of interchip metallization other than low temperature melting metals/alloys to include any sputterable material (e.g., high temperature superconducting metals). In addition, it reduces the complexity and engineering of the underfill formulation and dispensing process.

Figure 1:
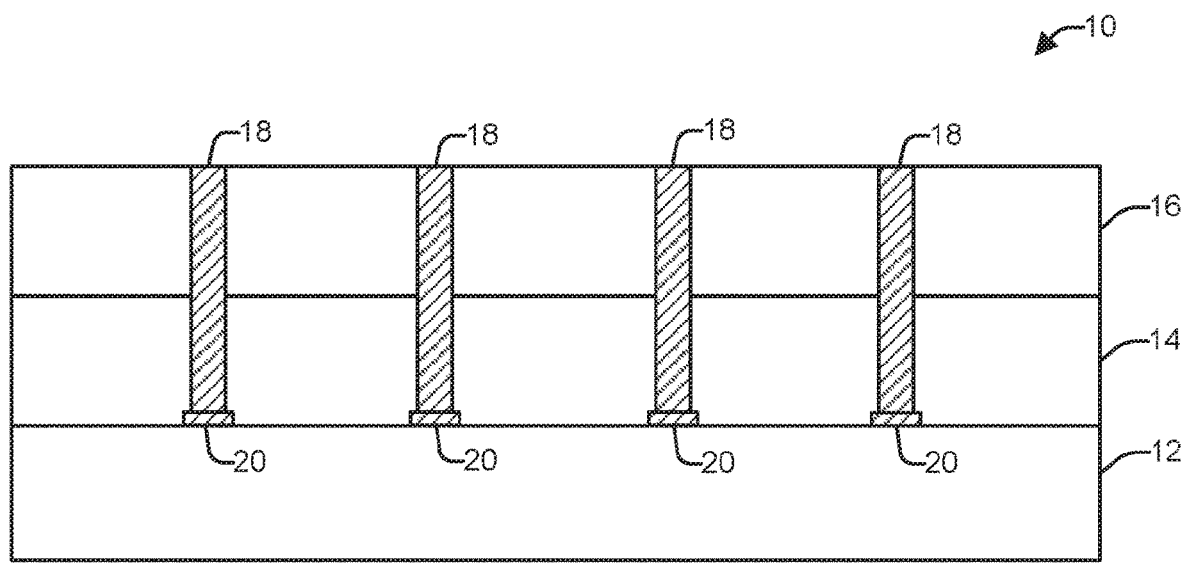
FIG. 1 illustrates cross-sectional view of a portion of an example integrated circuit.

FIG. 1 illustrates a schematic cross-sectional view of a portion of an example bumpless superconductor device 10. A first substrate 12 includes a plurality of conductive contact pads 20 spaced apart from one another across a top surface of the first substrate 12. The plurality of conductive contact pads 20 can be coupled to underlying devices in the first substrate 12 via conductive contacts (not shown) and/or conductive lines (not shown) within the first substrate 12. A second substrate 16 is aligned and bonded to the first substrate 12 by a dielectric layer 14. A plurality of superconducting contacts 18 extend from a top surface of the second substrate 16 through the second substrate 16, and the dielectric layer 14 to respective contact pads of the plurality of contact pads 20 disposed on the top surface of the first substrate 12. A dielectric liner can be deposited to line or fill the vias prior to formation of the plurality of superconducting contacts 18.

The first and second substrates 12 and 16 can be formed of silicon, glass, compound semiconductor or some other substrate material. The plurality of superconducting contacts 18 can be formed of a superconducting material, such as aluminum, niobium, niobium titanium nitride, niobium nitride or some other superconducting material, compound or alloy. The dielectric layer 14 can be a spin-on thermally curable polymer dielectric or other dielectric material that can provide both bonding of the first substrate 12 and the second substrate 16 and electrical isolation of the plurality of superconducting contacts 18. Alternatively, a bonding agent can be employed to bond the first substrate 12 and the second substrate 16 to the dielectric layer 14.

Figure 2:
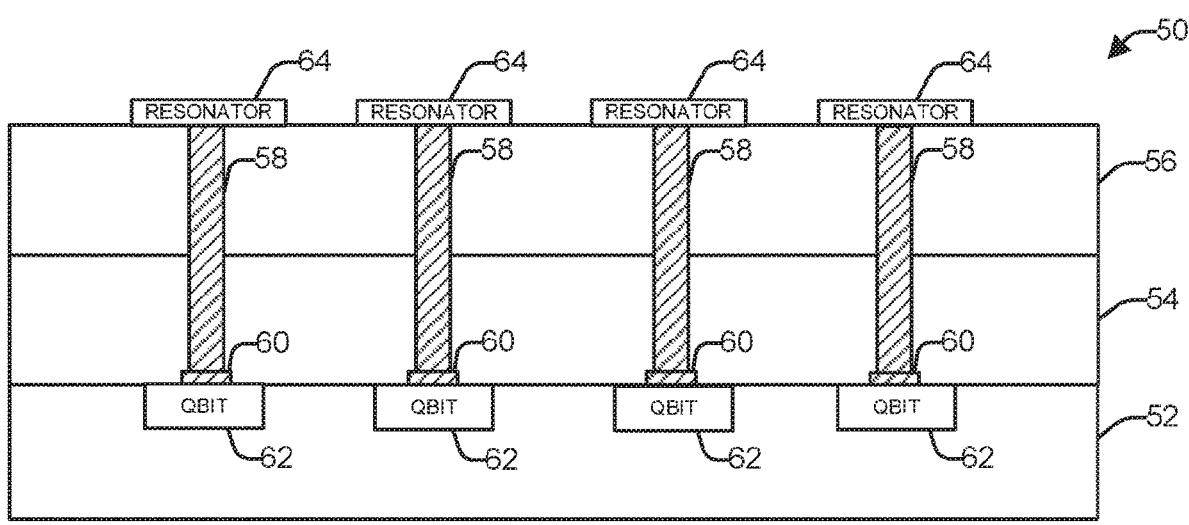
FIG. 2 illustrates cross-sectional view of a portion of another example integrated circuit.

FIG. 2 illustrates schematic cross-sectional view of a portion of an example bumpless superconductor device 50 with superconducting elements. A first substrate 52 includes a plurality of conductive contact pads 60 spaced apart from one another across a top surface of the first substrate 52. Each of the plurality of conductive contact pads 60 are coupled to a respective qubit device 62 disposed within the first substrate 52. Although illustrated as the qubit devices 62 and the conductive contact pads 60 being directly coupled together, the coupling could occur via conductive contacts and/or conductive lines within the first substrate 52. A second substrate 56 is aligned and bonded to the first substrate 52 by a dielectric layer 54. A plurality of superconducting contacts 58 extend from a top surface of the second substrate 56 through the second substrate 56 and the dielectric layer 54 to respective conductive contact pads of the plurality of conductive contact pads 60 disposed on the top surface of the first substrate 52.

A first end of each respective superconducting contact 58 is coupled to a respective resonator 64 on the top surface of the second substrate 56, and a second end of each respective superconducting contact 58 is coupled to a respective conductive contact pad 60, and thus a respective qubit device 62. The resonators 64 can be printed or etched into the top surface of the second substrate 56. Similar to FIG. 1, the first and second substrates 52 and 56 can be formed of silicon or another structural material, the plurality of superconducting contacts 58 can be formed of a superconducting material, such as aluminum, niobium, or some other superconducting material, and the dielectric layer 54 can be a spin-on thermally curable polymer dielectric or other dielectric material.

Turning now to FIGS. 3-15, fabrication is discussed in connection with formation of the bumpless superconductor device of FIG. 1. A first methodology is illustrated in FIGS. 3-9 in which vias are formed through a top substrate and through a dielectric layer after bonding of two substrate together via the dielectric layer. A second methodology is illustrated in FIGS. 10-15 in which vias are formed through a top substrate and a dielectric layer separately, and the top substrate is disposed over the dielectric layer are aligned with the vias of the top substrate being aligned with respective vias of the dielectric layer followed by the bonding of the top and bottom substrates together by through the dielectric layer.

Figure 3:
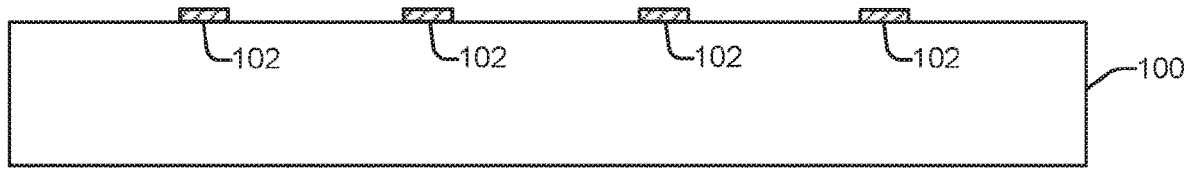
FIG. 3 illustrates a cross-sectional view of a first portion of a bumpless superconductor device in its early stages of fabrication in accordance with a first methodology.

FIG. 3 illustrates a cross-sectional view of a first portion of a bumpless superconductor device in its early stages of fabrication in accordance with a first methodology. A first substrate 100 is provided that includes a plurality of conductive contact pads 102 spaced apart from one another across a top surface of the first substrate 100. The first substrate can be formed of silicon or other structural material. The plurality of conductive contact pads 102 can be coupled to underlying devices in the first substrate 100 via conductive contacts (not shown) and/or conductive lines (not shown) within the first substrate 100. The plurality of conductive contact pads 102 can be formed by a photoresist patterning and contact material fill deposition processes. The photoresist can be stripped away or lifted off to form the plurality of conductive contact pads 102.

Figure 4:
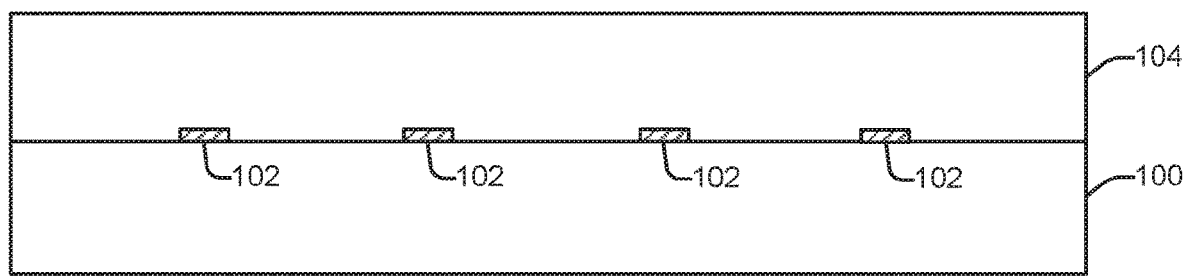
FIG. 4 illustrates a cross-sectional view of the structure of FIG. 3 after deposition of an overlying dielectric layer.
Figure 5:
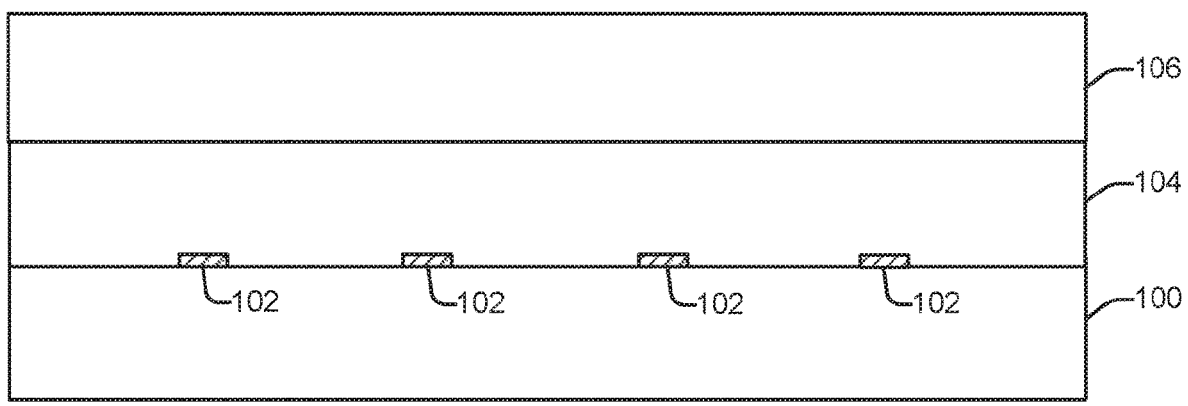
FIG. 5 illustrates a cross-sectional view of the structure of FIG. 4 after disposing a second substrate over the dielectric layer.

As illustrated in FIG. 4, a dielectric layer 104 is formed over the first substrate 100. Any suitable technique for forming the dielectric layer 104 may be employed such as Low Pressure Chemical Vapor Deposition (LPCVD), Plasma Enhanced Chemical Vapor Deposition (PECVD), High Density Plasma Chemical Vapor Deposition (HDPCVD), sputtering or spin-on techniques to a thickness suitable for providing an interconnect layer. The dielectric layer 104 can be a spin-on thermally curable polymer dielectric or other dielectric material that can provide both bonding properties and electrical isolation properties. Next, as illustrated in FIG. 5, a second substrate 106 is disposed over the dielectric layer 104 and aligned with the first substrate 100. The structure of FIG. 5 undergoes an oven baking process or other thermal process to cure the dielectric material layer 104 and bond the second substrate 106 to the first substrate 100.

Figure 6:
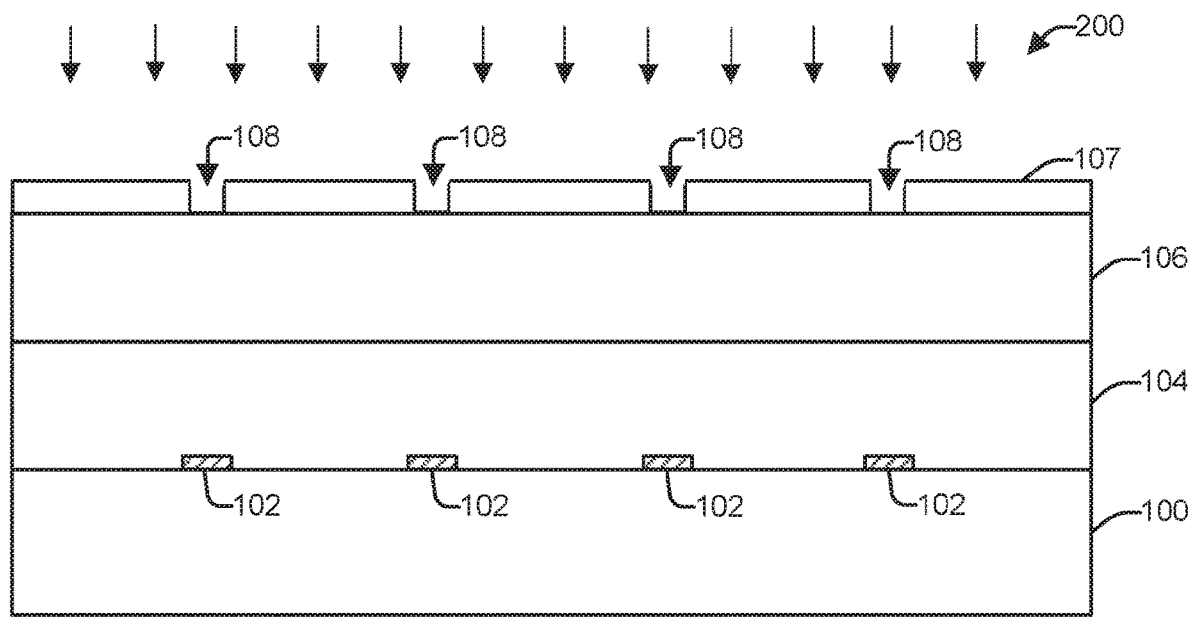
FIG. 6 illustrates a cross-sectional view of the structure of FIG. 5 after deposition and patterning of a photoresist material layer and while undergoing a first etch process.

As illustrated in FIG. 6, a photoresist material layer 107 has been applied to cover the structure of FIG. 5 and patterned and developed to expose via openings 108 in the photoresist material layer 107 in accordance with a via pattern. The photoresist material layer 107 can have a thickness that varies in correspondence with the wavelength of radiation used to pattern the photoresist material layer 107. The photoresist material layer 107 may be formed over the second substrate 106 via spin-coating or spin casting deposition techniques, selectively irradiated (e.g., via deep ultraviolet (DUV) irradiation) and developed to form the via openings 108.

FIG. 6 also illustrates performing of an etch 200 (e.g., anisotropic reactive ion etching (RIE)) on the second substrate 106 to form through substrate via (TSV) openings 110 (FIG. 7) in the second substrate 106 based on the via pattern in the photoresist material layer 107. The etch step 200 can be a dry etch and employ an etchant which selectively etches the underlying second substrate 106 at a faster rate than the overlying photoresist material layer 107, and the underlying dielectric layer 104. For example, the second substrate 106 may be anisotropically etched with a plasma gas(es), herein carbon tetrafloride ($CF_4$) containing fluorine ions, in a commercially available etcher, such as a parallel plate RIE apparatus or, alternatively, an electron cyclotron resonance (ECR) plasma reactor to replicate the mask pattern of the patterned of the photoresist material layer 107 to thereby create the TSV openings 110. The photoresist material layer 107 is thereafter removed using an oxygen based plasma and wet cleaned to remove organic residues. As a result, the TSV openings 110 extend to the surface of the dielectric layer 104.

Figure 7:
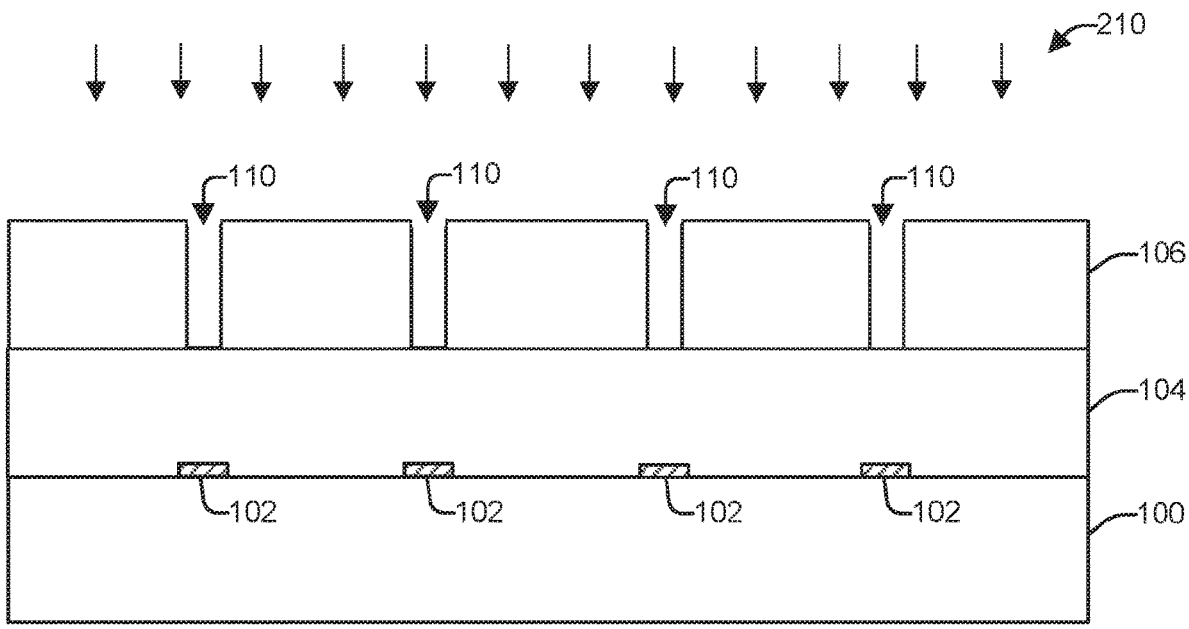
FIG. 7 illustrates a cross-sectional view of the structure of FIG. 6 while undergoing a second etch process.
Figure 8:
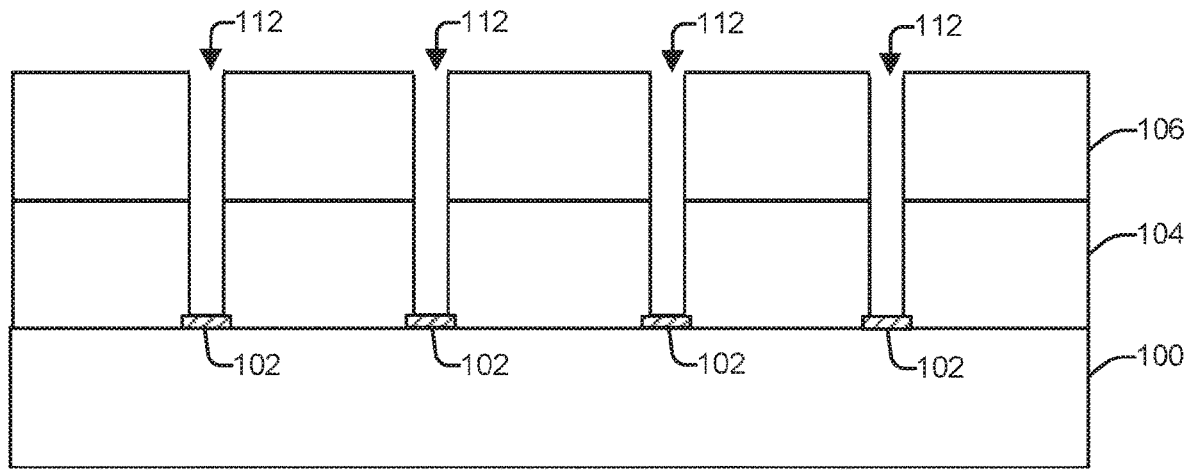
FIG. 8 illustrates a cross-sectional view of the structure of FIG. 7 after undergoing the second etch process.

FIG. 7 also illustrates performing of a second etch 210 to form extended via openings 112 (FIG. 8) through the dielectric layer 104 to the first substrate 100 based on the TSV pattern in the second substrate 106. The etch step 210 can be a dry etch and employ an etchant which selectively etches the underlying dielectric layer 104 at a faster rate than the overlying second substrate 106, and the underlying first substrate 100. For example, the second etch 210 can be an oxygen plasma etch to form the extended via openings 112 with each respective extended opening being aligned with a respective conductive contact pad of the plurality of conductive contact pads 102, as illustrated in FIG. 8.

Figure 9:
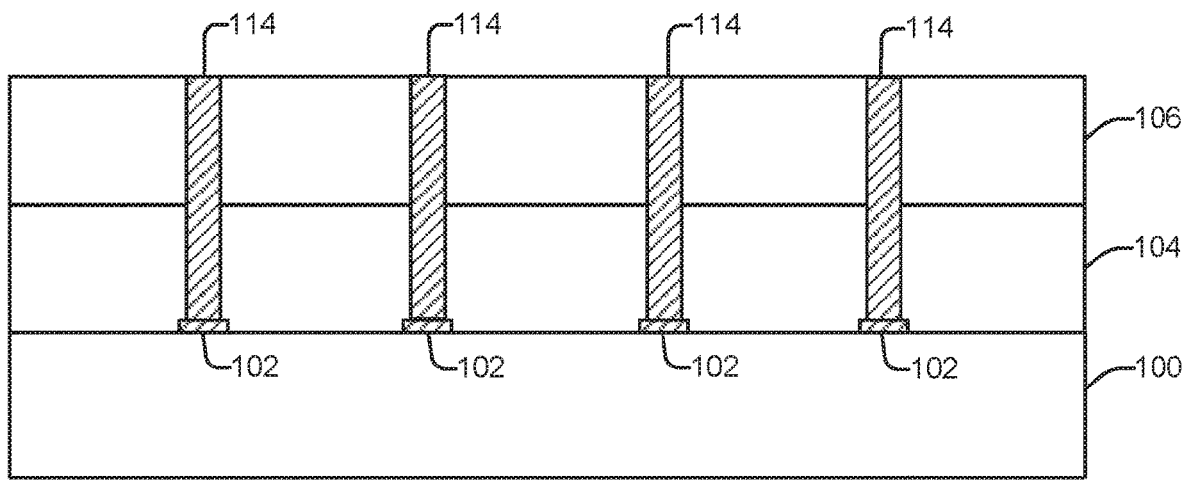
FIG. 9 illustrates a cross-sectional view of the structure of FIG. 8 after a superconducting material fill process.

Next, the structure then undergoes a contact material fill to deposit a superconducting material, such as aluminum, into the extended via openings 112 to form a plurality of superconducting contacts 114 (FIG. 9) that extend from a top surface of the second substrate 106 to respective contact pads of the plurality of contact pads 102. A dielectric liner can be deposited to line or fill the extended via openings 112 prior to formation of the plurality of superconducting contacts 114. The contact material fill can be deposited employing a standard contact material deposition. Following deposition of the contact material fill, the contact material can be polished via chemical mechanical polishing (CMP) down to the surface level of the second substrate 106. The final resultant structure is illustrated in FIG. 9.

Figure 10:
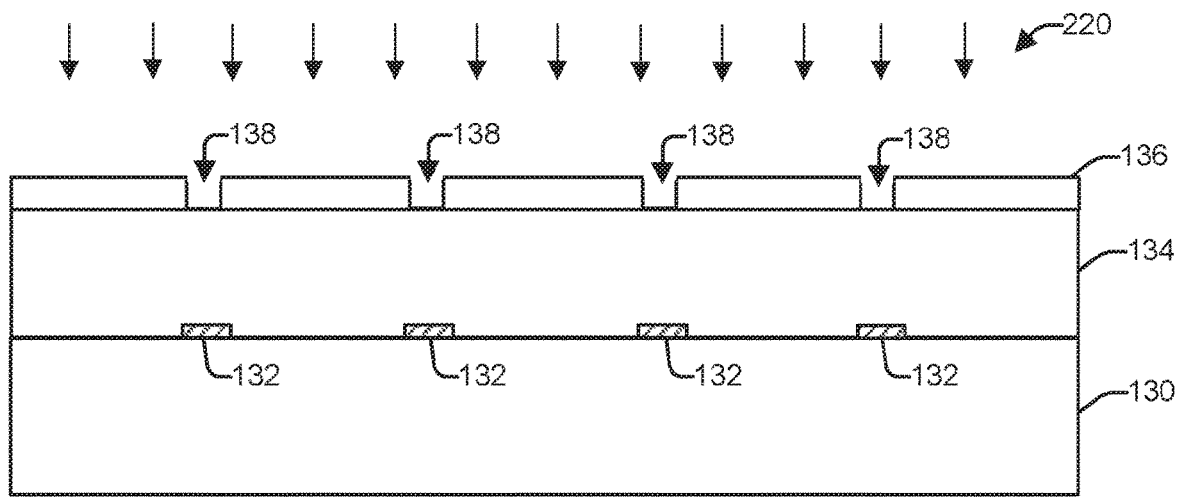
FIG. 10 illustrates a cross-sectional view of a first portion of a bumpless superconductor device in its early stages of fabrication in accordance with a second methodology, and while undergoing a first etch process.

FIG. 10 illustrates a cross-sectional view of a first portion of a bumpless superconductor device in its early stages of fabrication in accordance with a second methodology. A first substrate 130 is provided that includes a plurality of conductive contact pads 132 spaced apart from one another across a top surface of the first substrate 130. The first substrate 130 can be formed of silicon or other structural material. The plurality of conductive contact pads 132 can be coupled to underlying devices in the first substrate 130 via conductive contacts (not shown) and/or conductive lines (not shown) within the first substrate 130. The plurality of conductive contact pads 132 can be formed by photoresist patterning and contact material fill deposition processes. The photoresist can be stripped away or lifted off to form the plurality of conductive contact pads 132.

A dielectric layer 134 is formed over the first substrate 130. Any suitable technique for forming the dielectric layer 134 may be employed such as Low Pressure Chemical Vapor Deposition (LPCVD), Plasma Enhanced Chemical Vapor Deposition (PECVD), High Density Plasma Chemical Vapor Deposition (HDPCVD), sputtering or spin-on techniques to a thickness suitable for providing an interconnect layer. The dielectric layer 134 can be a spin-on thermally curable polymer dielectric or other dielectric material that can provide both bonding properties and electrical isolation properties. This polymer can also be photoimageable meaning a separate photoresist patterning step is not necessary. A material like SU-8 or certain polyimides act as both structural dielectric and are photoimageable.

A patterned photoresist material layer 136 has been applied to cover the structure of FIG. 10, and patterned and developed to expose via openings 138 in the photoresist material layer 136 in accordance with a via pattern. The photoresist material layer 136 can have a thickness that varies in correspondence with the wavelength of radiation used to pattern the photoresist material layer 136. The photoresist material layer 36 may be formed over the dielectric layer via spin-coating or spin casting deposition techniques, selectively irradiated (e.g., via deep ultraviolet (DUV) irradiation) and developed to form the via openings 138.

Figure 11:
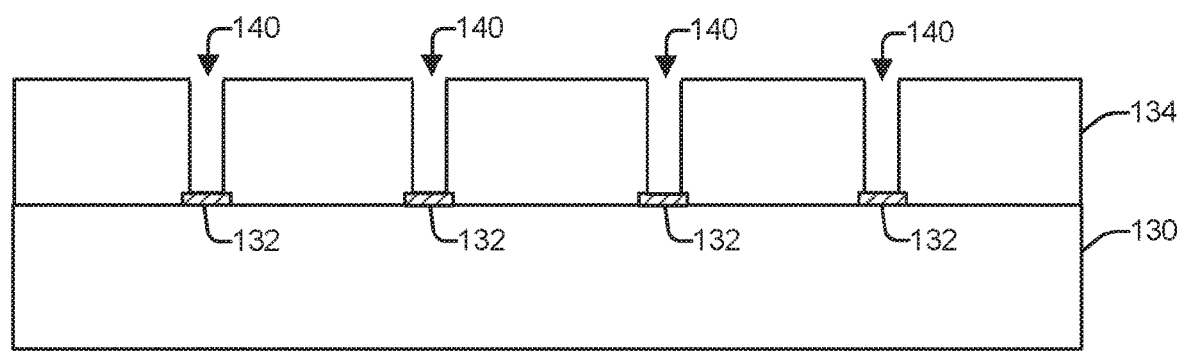
FIG. 11 illustrates a cross-sectional view of the structure of FIG. 10 after undergoing the first etch process.

FIG. 10 also illustrates performing of an etch 220 (e.g., anisotropic reactive ion etching (RIE)) on the dielectric layer 134 to form extended via openings 140 (FIG. 11) to the first substrate 130 based on the via pattern in the photoresist material layer 136. The etch step 220 can be a dry etch and employ an etchant which selectively etches the underlying dielectric layer 134 at a faster rate than the overlying photoresist layer 136. For example, the etch 220 can be an oxygen plasma etch to form the extended via openings 140 with each respective extended via opening 140 being aligned with a respective conductive contact pad of the plurality of conductive contact pads 132, as illustrated in FIG. 11.

Figure 12:
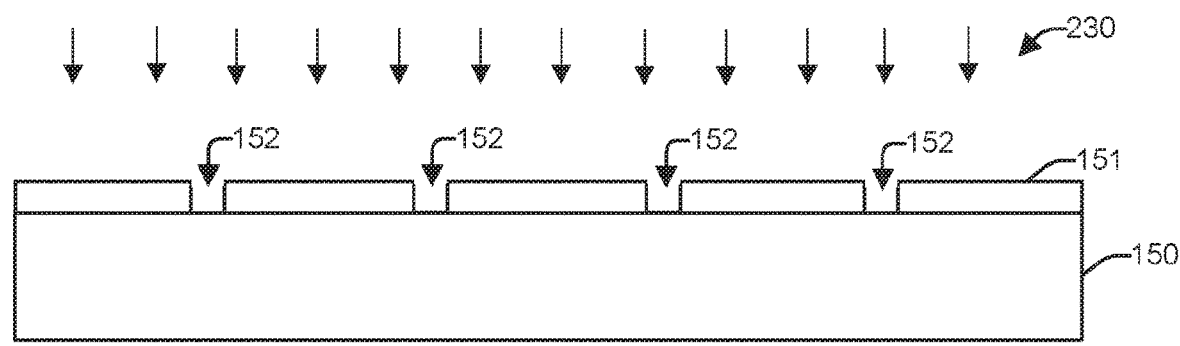
FIG. 12 illustrates a cross-sectional view of a second substrate undergoing a second etch process.

Next, as illustrated in FIG. 12, a second substrate 150 is provided. As illustrated in FIG. 12, a photoresist material layer 151 has been applied, to cover the structure of FIG. 12, and patterned and developed to expose openings 152 in the photoresist material layer 151 in accordance with a via pattern. The photoresist material layer 151 can have a thickness that varies in correspondence with the wavelength of radiation used to pattern the photoresist material layer 151. The photoresist material layer 151 may be formed over the second substrate 150 via spin-coating or spin casting deposition techniques, selectively irradiated (e.g., via deep ultraviolet (DUV) irradiation) and developed to form the via openings 152.

Figure 13:
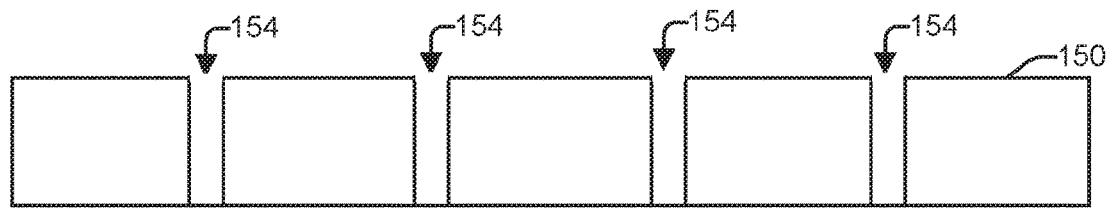
FIG. 13 illustrates a cross-sectional view of the structure of FIG. 12 of the second substrate after undergoing the second etch process.

FIG. 12 also illustrates performing of an etch 230 (e.g., anisotropic reactive ion etching (RIE)) on the second substrate 150 to form through substrate via (TSV) openings 154 (FIG. 13) in the second substrate 150 based on the via pattern in the photoresist material layer 151. The etch step 230 can be a dry etch and employ an etchant which selectively etches the second substrate 150. For example, the second substrate 150 may be anisotropically etched with a plasma gas(es), herein carbon tetrafloride ($CF_4$) containing fluorine ions, in a commercially available etcher, such as a parallel plate RIE apparatus or, alternatively, an electron cyclotron resonance (ECR) plasma reactor to replicate the mask pattern of the patterned of the photoresist material layer 151 to thereby create the TSV openings 154 (FIG. 13). The photoresist material layer 151 is thereafter removed using an oxygen based plasma and wet cleaned to remove organic residues to provide the resultant structure of FIG. 13.

Figure 14:
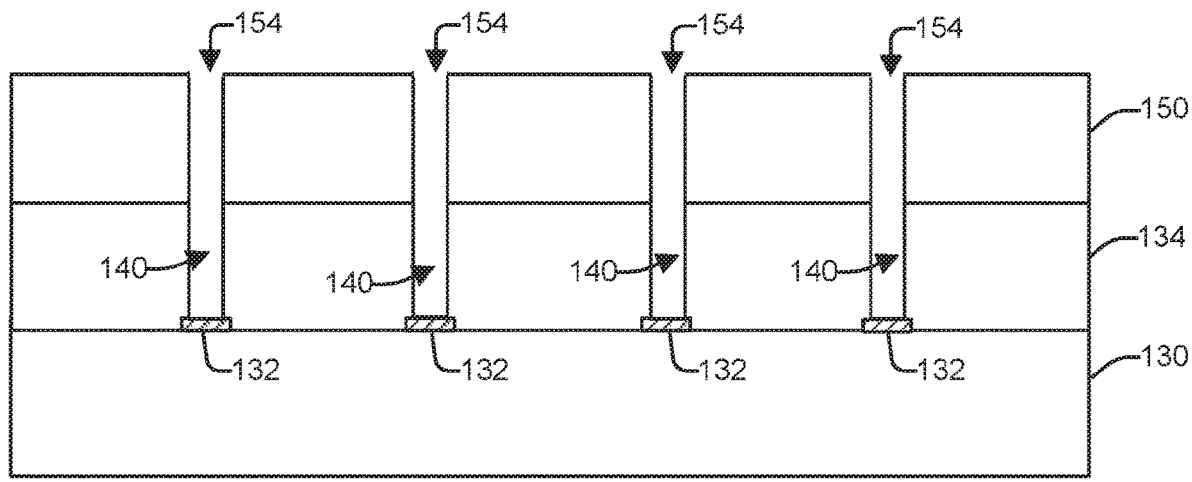
FIG. 14 illustrates a cross-sectional view of the structure of FIG. 11 after disposing of the second substrate of FIG. 13 over the structure of FIG. 11.
Figure 15:
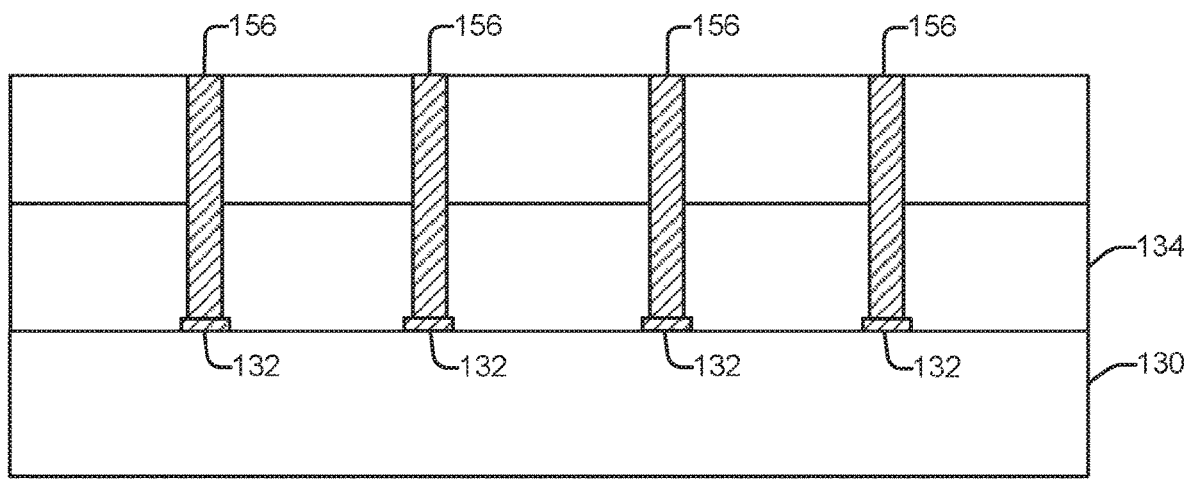
FIG. 15 illustrates a cross-sectional view of the structure of FIG. 14 after a superconducting material fill process.

As illustrated in FIG. 14, the second substrate 150 is disposed over the dielectric layer 134 with the TSV openings 154 of the second substrate 150 being aligned with the extended via openings 140 of the dielectric layer 134. The structure of FIG. 14 undergoes an oven baking process or other thermal process to cure the dielectric material layer 134 and bond the second substrate 150 to the first substrate 130. Next, the structure then undergoes a contact material fill to deposit a superconducting material, such as aluminum, into the TSV openings 150 and the extended via openings 140 to form a plurality of superconducting contacts 156 (FIG. 15). A dielectric liner can be deposited to line or fill the openings 150 and 140 prior to formation of the plurality of superconducting contacts 156. The contact material fill can be deposited employing a standard contact material deposition. Following deposition of the contact material fill, the superconducting material is polished via chemical mechanical polishing (CMP) down to the surface level of the second substrate to provide the resultant structure of FIG. 15.

There are many potential variations to the above described process flow with various types of chips being integrated. For example, in an alternate method, the performing of the etch 230 to form the through substrate via (TSV) openings 154 in the second substrate 150 occurs after the second substrate 150 is bonded to the dielectric layer 134. The TSV openings 154 are aligned with the extended via openings 140 in the dielectric layer 134. This type of methodology allows for cavities between the bottom and top substrate which would keep sensitive structures (e.g., Qubits) from being covered by dielectric in the final stack.

As another example, it's possible to imagine bonding two substrates wherein only the bottom substrate has completed IC fabrication. The top substrate being bare requires no precise alignment to the lower layer during bonding since there are no pads to align to. Once bonded the use of xray or IR imaging can be used to align fiducials on the top side of the top substrate to align precisely with pads on the bottom substrate. Top substrate IC fabrication proceeds on the bonded substrate pair until final TSV drilling. This process could also facilitate the formation of hermetically sealed cavities using a photoimageable dielectric to form openings in the interchip dielectric. After bonding, vias could be formed to open to these cavities followed by metal sputtering in vacuum to close the vias. Additionally, the present examples illustrate the bonding of two substrates, but the methodologies could be extended to a structure with three or more substrates.

For purposes of simplification of explanation the terms "overlay", "overlaying", "overlying", "underlay" and "underlying" (and derivatives) are employed throughout this disclosure to denote a relative position of two adjacent surfaces in a selected orientation. Additionally, the terms "top" and "bottom" employed throughout this disclosure denote opposing surfaces in the selected orientation. Similarly, the terms "upper" and "lower" denote relative positions in the selected orientation are for purposes of illustration. In fact, the examples used throughout this disclosure denote one selected orientation. In the described examples, however, the selected orientation is arbitrary and other orientations are possible (e.g., upside down, rotated by 90 degrees, etc.) within the scope of the present disclosure.

Described above are examples of the subject disclosure. It is, of course, not possible to describe every conceivable combination of components or methodologies for purposes of describing the subject disclosure, but one of ordinary skill in the art may recognize that many further combinations and permutations of the subject disclosure are possible. Accordingly, the subject disclosure is intended to embrace all such alterations, modifications and variations that fall within the spirit and scope of the appended claims. In addition, where the disclosure or claims recite "a," "an," "a first," or "another" element, or the equivalent thereof, it should be interpreted to include one or more than one such element, neither requiring nor excluding two or more such elements. Furthermore, to the extent that the term "includes" is used in either the detailed description or the claims, such term is intended to be inclusive in a manner similar to the term "comprising" as "comprising" is interpreted when employed as a transitional word in a claim. Finally, the term "based on" is interpreted to mean at least based in part.

What is claimed is:

1. An integrated circuit comprising:
a first substrate having a plurality of conductive contact pads spaced apart from one another on a surface of the first substrate;
a dielectric layer overlying the first substrate and the plurality of conductive contact pads;
a second substrate overlying the dielectric layer, and
a plurality of superconducting contacts extending through the second substrate and the dielectric layer to the first substrate, wherein each superconducting contact of the plurality of superconducting contacts is aligned with and in contact with a respective conductive contact pad of the plurality of conductive contact pads, wherein the integrated circuit further comprises a first qubit and a second qubit disposed within the first substrate, wherein a first of the plurality of conductive contact pads is coupled to the first qubit and a second of the plurality of conductive contact pads is coupled to the second qubit.

2. The integrated circuit of claim 1, wherein the dielectric layer is a thermally curable polymer.

3. The integrated circuit of claim 1, wherein the first substrate is formed of one of silicon, glass, or compound semiconductors.

4. The integrated circuit of claim 1, wherein the plurality of superconducting contacts are formed of one of aluminum, niobium, niobium titanium nitride, and niobium nitride.

5. The integrated circuit of claim 1, wherein the second substrate is formed of one of silicon, glass, or compound semiconductors.

6. An integrated circuit comprising:
a first substrate having a plurality of conductive contact pads spaced apart from one another on a surface of the first substrate;
a dielectric layer overlying the first substrate and the plurality of conductive contact pads;
a second substrate overlying the dielectric layer; and
a plurality of superconducting contacts extending through the second substrate and the dielectric layer to the first substrate, wherein each superconducting contact of the plurality of superconducting contacts is aligned with and in contact with a respective conductive contact pad of the plurality of conductive contact pads, and wherein the integrated circuit further comprises a plurality of qubits disposed within the first substrate, such that each of the plurality of conductive contact pads is coupled to a respective qubit of the plurality of qubits.

7. The integrated circuit of claim 6, wherein the dielectric layer is a thermally curable polymer.

8. The integrated circuit of claim 6, wherein the first substrate is formed of one of silicon, glass, or compound semiconductors.

9. The integrated circuit of claim 6, wherein the second substrate is formed of one of silicon, glass, or compound semiconductors.

10. The integrated circuit of claim 6, wherein the plurality of superconducting contacts are formed of one of aluminum, niobium, niobium titanium nitride, and niobium nitride.

11. The integrated circuit of claim 6, further comprising a plurality of resonators disposed on the second substrate.

12. The integrated circuit of claim 11, wherein each of the plurality of resonators disposed on the second substrate is printed on a top surface of the second substrate.

13. The integrated circuit of claim 11, wherein each of the plurality of resonators disposed on the second substrate is etched into a top surface of the second substrate.

14. An integrated circuit comprising:
a first substrate having a plurality of conductive contact pads spaced apart from one another on a surface of the first substrate;
a dielectric layer overlying the first substrate and the plurality of conductive contact pads;
a second substrate overlying the dielectric layer; and
a plurality of superconducting contacts extending through the second substrate and the dielectric layer to the first substrate, wherein each superconducting contact of the plurality of superconducting contacts is aligned with and in contact with a respective conductive contact pad of the plurality of conductive contact pads, wherein the integrated circuit further comprises a plurality of qubits disposed within the first substrate, such that each of the plurality of conductive contact pads are coupled to a respective qubit of the plurality of qubits, and wherein the integrated circuit further comprises a plurality of resonators disposed on the second substrate, such that each of the plurality of superconducting contacts are coupled to a respective resonator of the plurality of resonators, and each respective resonator of the plurality of resonators is coupled to a respective qubit of the plurality of qubits.

15. The integrated circuit of claim 14, wherein the dielectric layer is a thermally curable polymer.

16. The integrated circuit of claim 14, wherein the first substrate is formed of one of silicon, glass, or compound semiconductors.

17. The integrated circuit of claim 16, wherein the second substrate is formed of one of silicon, glass, or compound semiconductors.

18. The integrated circuit of claim 14, wherein the plurality of superconducting contacts are formed of one of aluminum, niobium, niobium titanium nitride, and niobium nitride.

19. The integrated circuit of claim 14, wherein each of the plurality of resonators disposed on the second substrate is printed on a top surface of the second substrate.

20. The integrated circuit of claim 14, wherein each of the plurality of resonators disposed on the second substrate is etched into a top surface of the second substrate.

* * * * *